United States Patent [19]
Angulas et al.

[11] Patent Number: 5,435,732
[45] Date of Patent: Jul. 25, 1995

[54] FLEXIBLE CIRCUIT MEMBER

[75] Inventors: Christopher G. Angulas, Endicott; Patrick T. Flynn, Owego; Joseph Funari, Vestal; Thomas E. Kindl, Endwell; Randy L. Orr, Vestal, all of N.Y.

[73] Assignee: International Business Machines Corporation, Armonk, N.Y.

[21] Appl. No.: 289,338

[22] Filed: Aug. 11, 1994

Related U.S. Application Data

[63] Continuation of Ser. No. 150,505, Nov. 9, 1993, abandoned, which is a continuation of Ser. No. 14,291, Feb. 5, 1993, Pat. No. 5,261,155, which is a continuation of Ser. No. 743,970, Aug. 12, 1991, Pat. No. 5,203,075.

[51] Int. Cl.⁶ .................... H05K 1/11; H05K 3/36; H01R 9/09
[52] U.S. Cl. ......................... 439/67; 29/831; 29/840; 174/254; 361/750; 361/751; 439/77
[58] Field of Search ............... 29/827–834, 29/840, 843, 852, 738, 760; 228/180.1, 180.2, 215; 361/386, 398, 414, 749–751, 757, 758; 174/254; 257/698, 738, 780; 439/65, 67, 83, 77

[56] References Cited

U.S. PATENT DOCUMENTS

| | | | |
|---|---|---|---|
| 3,662,230 | 5/1972 | Redwantz | 439/68 X |
| 3,775,844 | 12/1973 | Parks | 29/830 |
| 3,953,924 | 5/1976 | Zachry et al. | 29/830 |
| 4,249,302 | 2/1981 | Crepeau | 29/830 |
| 4,251,852 | 2/1981 | Ecker et al. | 361/749 X |
| 4,316,320 | 2/1982 | Nogawa et al. | 29/832 X |
| 4,343,083 | 8/1982 | Takemura et al. | 29/832 |
| 4,549,200 | 10/1985 | Ecker et al. | 361/748 X |
| 4,700,473 | 10/1987 | Freyman et al. | 29/830 X |
| 4,744,008 | 5/1988 | Black et al. | 361/750 X |
| 4,788,767 | 12/1988 | Desai et al. | 29/830 |
| 4,818,728 | 4/1989 | Rai et al. | 29/830 X |
| 4,827,376 | 5/1989 | Voss | 29/827 X |
| 4,891,014 | 1/1990 | Simpson et al. | 439/67 |
| 4,935,584 | 6/1990 | Boggs | 361/414 X |
| 4,965,700 | 10/1990 | McBride | 361/751 |
| 5,003,429 | 3/1991 | Baker et al. | 361/749 X |
| 5,023,202 | 6/1991 | Long et al. | 437/206 |
| 5,045,921 | 9/1991 | Lin et al. | 257/698 X |
| 5,093,761 | 3/1992 | Ozaki | 361/749 X |
| 5,099,393 | 3/1992 | Bentlage et al. | 439/77 X |
| 5,168,430 | 12/1992 | Nitsch et al. | 361/749 |
| 5,203,075 | 4/1993 | Angulas et al. | 29/830 |
| 5,261,155 | 11/1993 | Angulas et al. | 29/830 |
| 5,278,724 | 1/1994 | Angulas et al. | 174/254 X |

FOREIGN PATENT DOCUMENTS 247893 12/1987 European Pat. Off. ............... 439/67

*Primary Examiner*—Peter Vo
*Attorney, Agent, or Firm*—Lawrence R. Fraley

[57] ABSTRACT

A flexible circuit member including a circuitized substrate of a dielectric material having a plurality of apertures therein. Located within and/or bridging selected ones of the apertures are electrical conductors, the conductors having a solder member secured thereto. A frame is also used, the circuitized substrate being secured thereto.

12 Claims, 4 Drawing Sheets

FLEXIBLE CIRCUIT MEMBER

The application is a continuation of application Ser. No. 08/150,505, filed Nov. 9, 1993, now abandoned, which is a continuation of application Ser. No. 08/014,291, filed on Feb. 5, 1993, now U.S. Pat. No. 5,261,155, which is a continuation of Ser. No. 07/743,970, filed Aug. 12, 1991, now U.S. Pat. No. 5,203,075.

TECHNICAL FIELD

This invention relates to the provision of electrical connections between two circuit members, particularly where one of these is a flexible circuit which may be utilized in an electronic package or the like. As used therein, such flexible circuits are also referred to as flexible thin film carriers.

CROSS-REFERENCE TO APPLICATION

In Ser. No. (S.N.) 07/578,711, filed Sep. 7, 1990 and entitled, "Method of Bonding Thin Film Electronic Device" (inventors: J. G. Ameen et al), there is defined a method of forming electrical connections, using solder, between a flexible film carrier and a semiconductor device (e.g., chip) wherein hot gas (e.g., nitrogen) is directed through a screen member to heat bridging leads in the flexible carrier to in turn cause these to heat the respective solder mounds to which these leads are engaged. The resulting structure may form part of an electronic package. This application is assigned to the same assignee as the present invention, and is incorporated herein by reference. Ser. No. 07/578,711 is now U.S. Pat. No. 5,057,969.

In Ser. No. 07/745,139; now U.S. Pat. No. 5,133,495, and entitled "Method of Bonding Flexible Circuit To Circuitized Substrate To Provide Electrical Connection Therebetween" (inventors: C. G. Angulas et al), there is defined a method for bonding two substrates wherein a solder paste is used. A second substrate is aligned over the paste (located on the first) and contact made between both substrates, either with the solder in "balled up" form or during such formation.

BACKGROUND OF THE INVENTION

Electronic packages which include at least one thin film, flexible circuit member as an integral part thereof are known in the industry, with examples being defined in U.S. Pat. Nos. 4,849,856 (J. Funari et al) and 4,914,551 (M. Anschel et al), both of which are assigned to the same assignee as the instant invention. In a more recent patent, also assigned to the same assignee as the present invention, there is defined a more specific example of such a flexible thin film carrier. See U.S. Pat. No. 4,937,707 (D. G. McBride et al). As mentioned therein, a main objective in the design of such circuit members and electronic packages is to provide these with as high current densities as possible within a minimum of space. Such miniaturization efforts, while providing several highly advantageous features, also present various engineering problems in both the manufacture and operation of these structures. In the aforementioned U.S. Pat. Nos. 4,849,356 and 4,914,551, for example, solutions to assure effective package heat removal during operation as well as facilitating package assembly are defined. The above three patents are incorporated herein by reference.

One particular problem facing designers of electronic packages containing thin film circuit structures is the essential requirement to provide sound electrical connections between the relatively large number of extremely small conductive elements (e.g., signal and/or ground) of the flexible circuit and the respective conductor locations at the circuitized substrate (e.g., printed circuit board to which the flexible circuit (and the chip thereon) is electrically coupled. As will be defined herein, the present invention defines a method of forming such electrical connections between a flexible circuit and substrate for use within structures such as electronic packages in order that relatively high circuit densities are attained. As will be further defined, these connections and the resulting structure are accomplished using solder. Even more particularly, such connections are achieved without use of a separate chemical flux or the like.

As is known, soldering represents a common technique for joining various objects together, including thin film and other circuits, as well as between flexible circuits and electronic devices (chips). Typically, the conductive portions of these structures (usually metallic, e.g., copper) have been coated with a chemical flux prior to joining. Solid solder is then placed between the flux-coated objects or a flux-filled solder paste is screen-printed onto one of the conductive portions and heated to a molten state in order that the molten solder coats the portions of these objects which in turn have been coated with such flux. Thereafter, the molten solder is cooled to form a joint between the two objects.

In microelectronic applications (e.g., for electronic package structures as defined herein), solder bonds are commonly used. In one technique, an electronic device (semiconductor chip) is mounted onto a packaging substrate (thin film structure) in a "flip-chip" orientation. In this orientation, the surface of the chip having contact locations is positioned facing the flexible, thin film circuit member. The contact locations on the chip and the respective thin film conductive elements are electrically connected using solder structures, also referred to as controlled collapse chip connections (c4's).

In the aforementioned Ser. No. 07/578,711, the method defined therein represents a significant improvement in providing flexible circuit-semiconductor device connections. Use of flux has been substantially eliminated. The method defined in U.S. Pat. No. 4,937,006, also assigned to the same assignee as the present invention, represents yet another improvement over existing and other previous techniques, primarily through effective gas direction control onto the respective solder mounds which form part of the connections being formed. U.S. Pat. No. 4,937,006 is also incorporated herein by reference.

As defined below, the present invention provides another significant improvement over currently known soldering techniques for performing electrical connections in miniaturized electronic packages. The method as defined herein assures sound, effective electrical connections between extremely small circuit members, particularly those found on the package's flexible circuit and the circuitized substrate (printed circuit board) to which it is to be bonded and electrically coupled. The defined method is relatively safe and can be adapted to mass production techniques, thus reducing the overall cost of such a final package structure.

It is believed that a flexible circuit member produced in accordance with the teachings herein and adapted for being electrically connected to a second circuit member (e.g., printed circuit board) as defined herein would constitute a significant advancement in the art.

DISCLOSURE OF THE INVENTION

It is, therefore, a primary object of the present invention to enhance the art of electrical connections between circuit members, and particularly the art of electronic packaging wherein such members may be utilized.

It is a further object of the invention to provide a method of forming sound, effective electrical connections between flexible film circuitized substrates (carriers) and an associated circuitized substrate for possible eventual use within an electronic package, wherein such connections can be accomplished in a safe and expeditious manner.

It is yet another object of the invention to provide a method as stated above which provides such connections in high circuit density configurations to thus substantially meet the miniaturization demands in today's packaging industry.

In accordance with one aspect of this invention, there is provide a flexible circuit member comprising a flexible circuitized substrate of a dielectric material and having a plurality of apertures therein. A conductor is located within and/or bridges selected ones of the apertures, and a solder member is second thereto. The substrate and solder members are secured to a frame.

BEST MODE FOR CARRYING OUT THE INVENTION

For a better understanding of the invention, together with other and further objects, advantages and capabilities thereof, reference is made to the following disclosure and appended claims in connection with the above-described drawings.

In FIGS. 1-6, there are shown the various steps of bonding a pair of circuitized substrates to provide a sound, effective electrical connection therebetween in accordance with one embodiment of the invention. As understood from the teachings herein, the invention is able to provide several such connections in a substantially simultaneous manner, if desired. Only one such connection will be described herein, for illustration purposes.

As also defined herein, the invention is particularly directed to the bonding of a flexible, thin film circuitized substrate to a more rigid, circuitized substrate, a particular example of the latter being a printed circuit board. It is to be understood, however, that the invention is not limited to attachment to printed circuit boards, in that other circuitized substrates, including known ceramic substrates, may be employed.

By the term "flexible circuit" as used herein is meant to define a flexible substrate of at least one layer of dielectric material (e.g., polyimide) having at least one conductive layer thereon. Examples of such thin film flexible substrates, particularly those ideally suited for utilization in electronic packages, are defined in the aforementioned U.S. Pat. Nos. 4,849,356, 4,914,551 and 4,937,707, all of which are assigned to the same assignee as the present invention. More recent versions of such substrates may include at least one additional conductive layer as part thereof (as in U.S. Pat. No. 4,937,707), and it is understood that such a circuit member may be utilized in the present invention. As clearly seen in U.S. Pat. No. 4,937,707, the flexible circuit defined therein includes a layer of electrically insulating material (e.g., polyimide) having two conductive layers (e.g., ground/power plane, electrical circuit) located on opposite sides thereof. As stated previously, this patent is incorporated herein by reference.

Figure 3:
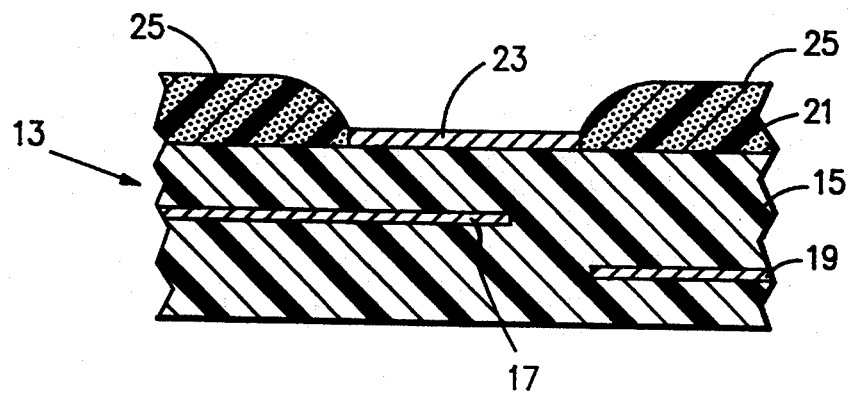

In FIG. 3, there is shown a first circuitized substrate 13 for use in the present invention. Circuitized substrate 13 includes a dielectric 15, preferably of a type known in the art. As stated above, the first circuitized substrate may comprise a printed circuit board, and thus the dielectric 15 is of a material, e.g., fiberglass reinforced epoxy resin, as typically used therein. Additionally, the invention is adaptable to printed circuit boards of the multilayered variety including therein a plurality of electrically conducting layers 17 and 19, which layers are also of a material (e.g., copper) known in the art. Printed circuit boards of this type are known, as well as the processes for making same, and further definition is not believed necessary. Such structures may include many more electrically conductive layers than those depicted in FIGS. 3-6, depending on the desired operational characteristics. As is known, such electrically conductive layers may function as signal, power and/or ground layers. As is understood, the aforementioned dielectric material (e.g., epoxy resin) is an organic dielectric material.

On an upper surface 21 of substrate 13 there is positioned at least one conductive pad 23 which, as defined herein, will eventually be electrically connected to an associated electrical conductor which forms part of a flexible circuitized substrate (FIGS. 1, 2, 5, 6 and 7). Conductive pad 23 is preferably copper or similar highly conductive material, as is known in the art. Conductive pad 23 is preferably positioned on substrate 13 by known deposition techniques, a preferred such technique being plating or lamination (wherein copper sheet material is laminated to the dielectric at elevated temperatures and pressures). As stated, the invention is adapted for providing a plurality of electrical connections in a simultaneous manner between the described two substrates. In one example, a total of about 500 conductive pads 23 may be applied to the upper surface 21 of substrate 13. Significantly, pads 23 can be arranged in any pattern, including, for example, a substantially square pattern with approximately 0.050 inch spacings therebetween. Other patterns are also clearly possible. Patterns of such pads at spacings such as the above are understood to be high density patterns. Understandably, each of these pads will be electrically connected to a respective conductor within the flexible circuitized substrate being joined. Further description of this connection is provided hereinbelow.

Figure 4:
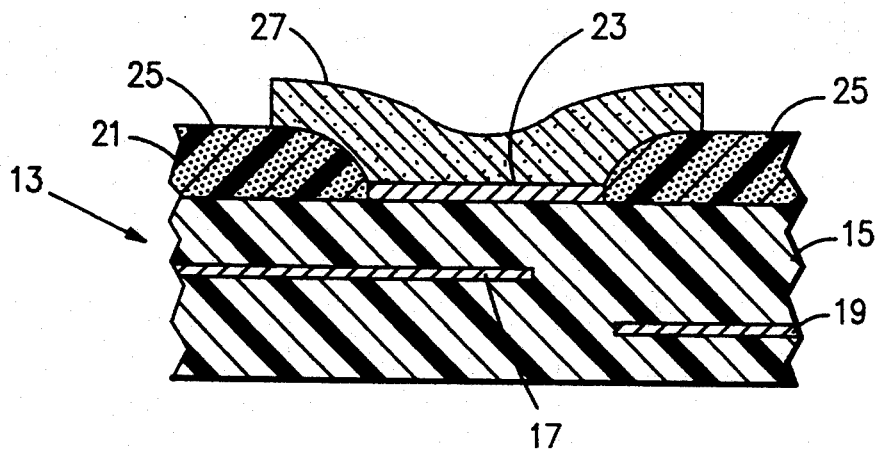

With pad 23 in place, the next step, as shown in FIG. 4, involves application of an organic dewetting material 25 adjacent pad 23. The preferred dewetting material is an organic material, with one example being a photosensitive, lacquer-forming substance capable of being applied in liquid form atop substrate 13 and subsequently cured. One particular example of such a material is Probimer 52, available from the Ciba-Geigy Corporation. (Probimer is a registered trademark of the Ciba-Geigy Corporation.) Probimer 52 is a liquid applied cinnamate/epoxy composition containing light sensitive chalcone groups and a thermal hardener for curing the epoxide groups. It may be conformally applied at approximately 38 percent solids and containing approximately 20 to 25 percent by weight resins of an inert organic filler such as magnesium silicate. It is to be understood that the invention is not limited to this particular material in that other organic dewetting materials may be utilized. Attention is also directed to U.S. Pat. No. 4,544,623 wherein photosensitive protective coatings for use on circuit boards are defined. U.S. Pat. No. 4,544,623 is incorporated herein by reference.

Figure 5:
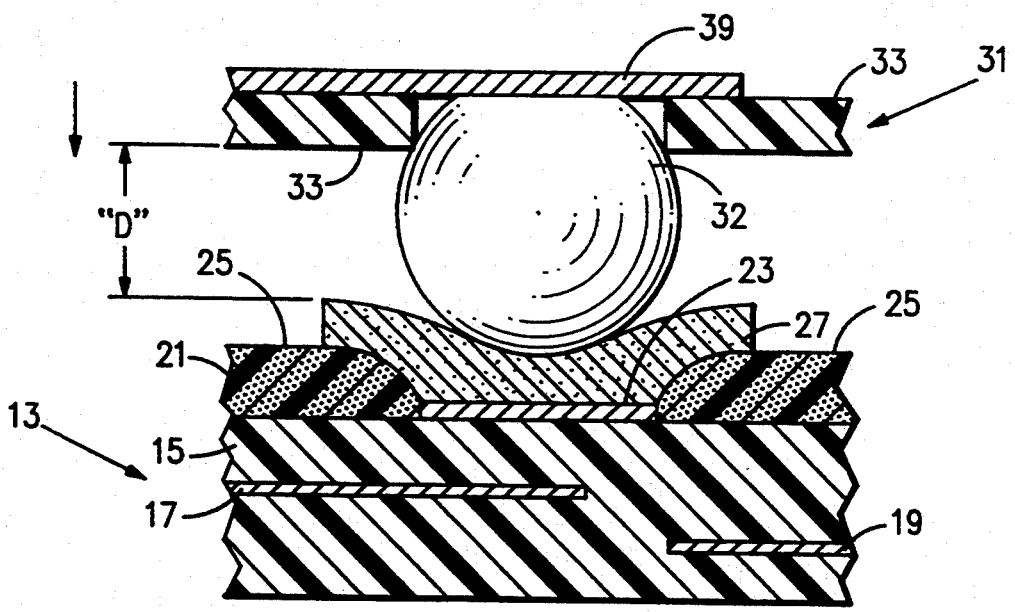

With dewetting material 25 in position adjacent (and, as shown in the drawings, contiguous) pad 23 and subsequently cured, the next step in the method of the invention involves application of a quantity of solder paste 27 to substantially cover the entire upper surface of pad 23 and, significantly, portions of dewetting material 25, particularly the curved sides thereof immediately adjacent pad 23. As shown in FIGS. 4 and 5, organic dewetting material 25 is of substantially curvilinear shape at the location nearest the outer edges of pad 23. Additionally, the dewetting material 25 is also slightly thicker than the pad, particularly at these immediately adjacent locations.

The preferred solder paste is 63:37 tin-lead solder, although the invention is not limited to this particular type. By the term 63:37 tin-lead solder is meant to define a solder composition which comprises about 63 percent tin and about 37 percent lead. A typical example of this type of paste includes 80% solder solids and 20% flux paste, although this application is not limited to this ratio. Solder paste 27, as stated, is applied in paste-like form, preferably using a screening procedure known in the art. During such a procedure, a screen made of compatible material (e.g., stainless steel) is aligned to and placed in contact with pads 23. The thickness of the screen and sizes of openings in the screen correspond to and define the desired thickness and area of solder paste. Solder paste is dispensed onto the screen, and a suitable squeegee type device is dragged across the screen, forcing the paste through the holes in the screen and into contact with pads 23. The screen is then removed, leaving the desired quantity of paste 27 on each pad 23.

Figure 9:
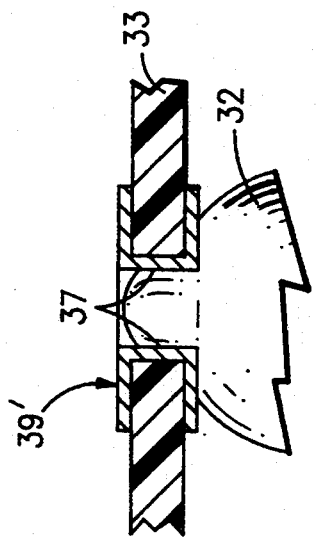
FIGS. 8 and 9 represent alternative embodiments of second substrates, and particularly the conductors for use therein, which may be used in the present invention.

With paste 27 in place (FIG. 4), the next step of the invention involves strategically positioning a thin flexible circuitized substrate 31 (FIGS. 1, 2, 5 and 6) relative to substrate 13. Preferably, substrate 31 is located substantially parallel to the substantially planar substrate 13 during such positioning and contact. A preferred device for use in aligning substrates 13 and 31 is defined hereinbelow regarding the description of FIG. 10. As mentioned, substrate 31 includes a dielectric material 33, (e.g., polyimide) having a conductive layer 35 (e.g., copper) thereon. Significantly, the flexible substrate 31 includes an aperture 37 therein, which aperture must align strategically with respect to paste 27. In one example of the invention, aperture 37 and the corresponding conductive pad 23 were both of substantially cylindrical configuration such that the axes thereof are aligned coincidentally to achieve the orientation depicted in FIG. 5. Attention is also directed to FIG. 7 for another illustration (perspective) of aperture 37. In accordance with the teachings of the invention, the conductor 39, which forms part of the conductive layer 35, bridges aperture 37 in the manner shown in both FIGS. 1, 2, 5, 6 and 7. This is considered a significant aspect of the present invention for reasons stated below. Although the embodiment of FIG. 7 illustrates the conductor 39 as completely bridging aperture 37, the teachings of the invention are readily adaptable to a thin flexible circuitized substrate wherein the conductor is also located substantially within aperture 37. One such example of this conductor-dielectric embodiment is illustrated in FIG. 9, wherein the conductor 39' is shown in the form of a plated-through-hole (PTH), examples of which are known in the art of printed circuit board technology. Understandably, conductor 39' includes a quantity of copper material located along the inner walls of aperture 37, which conductive material may extend over onto both upper and lower surfaces of the substrate's dielectric 33. Conductor 39 may also include additional features not illustrated herein. For example, suitable apertures, notches, indentations, etc. may be provided therein for enhanced flexibility during the manufacturing process. The conductor may also be curvilinear rather than substantially planar shaped as illustrated in FIG. 7. Still further, it is also understood that aperture 37 is not limited to the substantially cylindrical shape illustrated in the drawings. Other shapes, including oval and rectangular, are acceptable.

Figure 6:
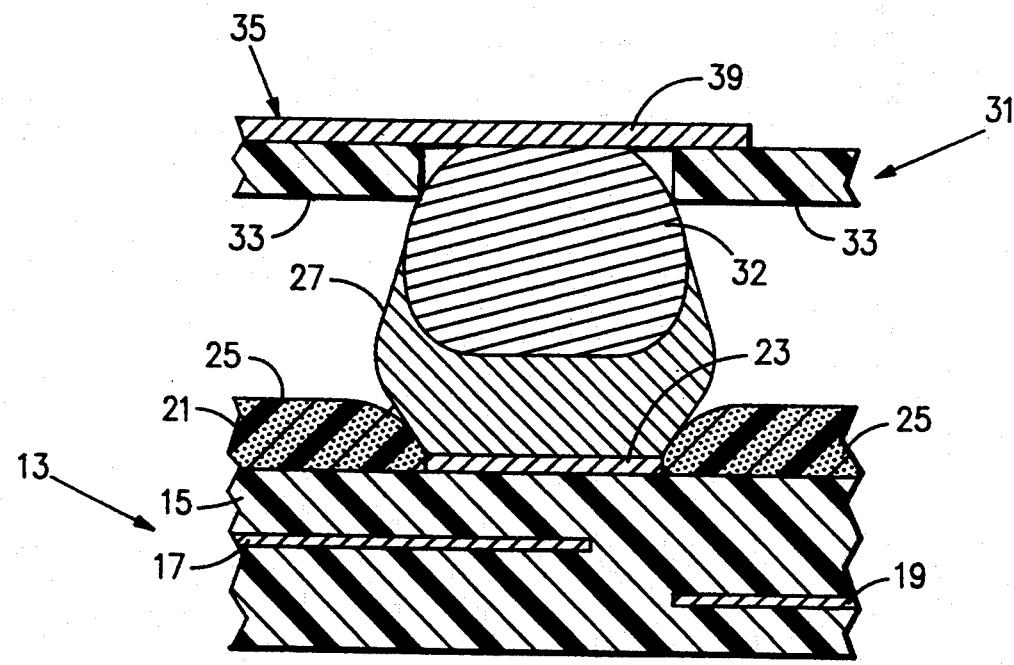
Figure 7:
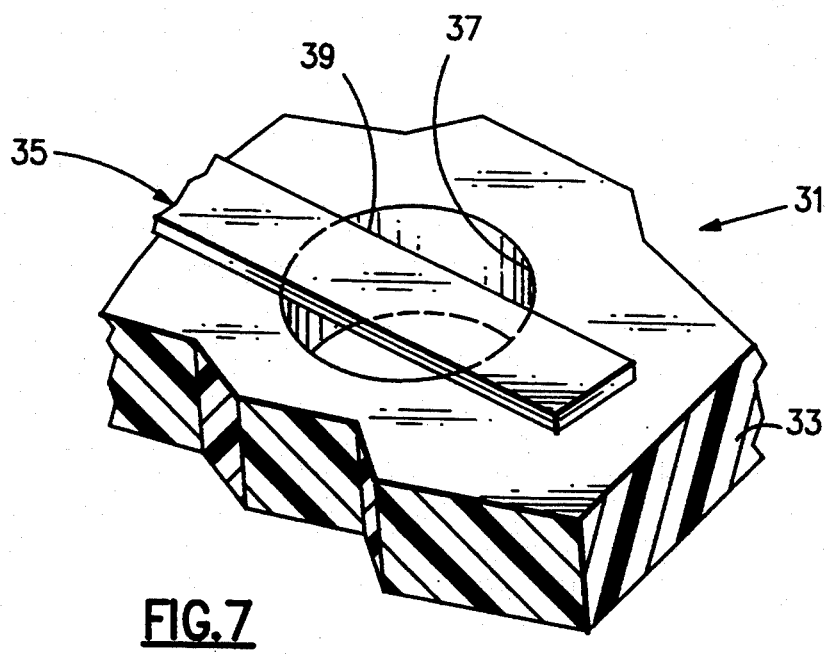
FIG. 7 is a partial view of an embodiment of a second substrate, including a bridging conductor across an aperture within the substrate's dielectric, as used in the method illustrated in FIGS. 1-6.
Figure 8:
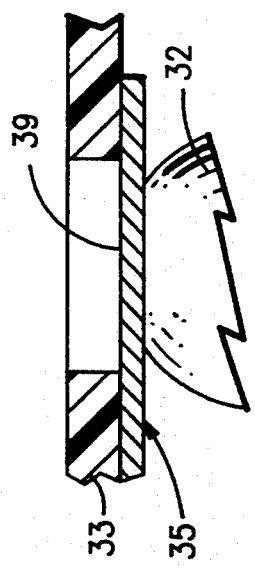

It is also understood from the teachings herein that the particular bridging location depicted in FIG. 7 is not meant to limit the invention, in that it is also possible to bond flexible substrates wherein the bridging conductor is located along a lower surface of the substrate's dielectric 33 in comparison to that depicted in FIGS. 1, 2, 5 and 6, one such example illustrated in FIG. 8. Thus, the invention is particularly adapted to flexible circuitized substrates possessing conductors arranged in accordance with the examples illustrated in FIGS. 7-9.

Figure 1:
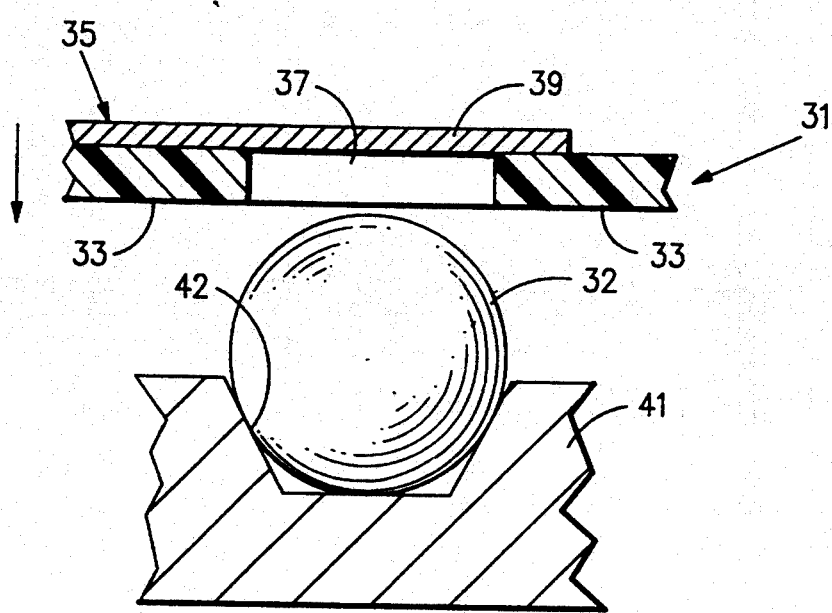
FIGS. 1-6 represent the various steps in bonding a pair of circuitized substrates to provide an electrical connection therebetween in accordance with one embodiment of the invention.
Figure 2:
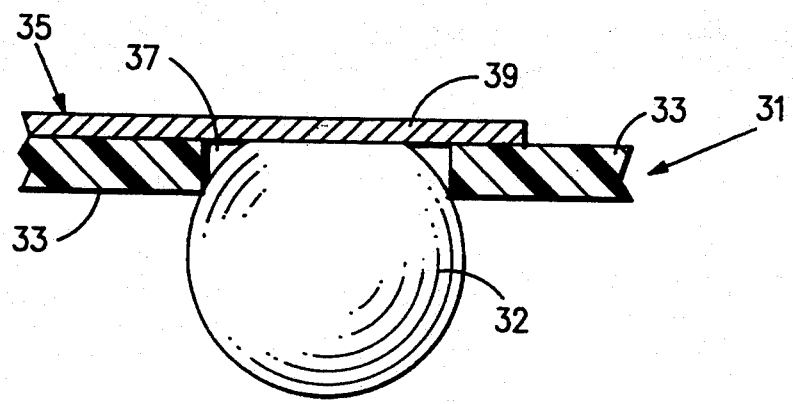

Prior to positioning substrate 31 (and aperture 37) relative to pad 23, the aforementioned solder member 32 is secured to the bridging conductor 39, the solder member being so secured within aperture 37. Solder member 32, preferably of substantially spherical configuration (as shown in FIGS. 1, 2 and 5), is preferably 10:90 tin:lead solder, having a melting point greater than the corresponding melting point for solder paste 27. 10:90 solder, as used herein, possesses a melting point within the range of from about 300 degrees Celsius (C.) to about 350 degrees C., while solder paste 27 possesses a melting point within the range of from about 170 degrees C. to about 225 degrees C. Several solder members 32 are preferably oriented within a suitable container 41 (e.g., titanium) such that each member is positioned within a respective indentation 42 therein. Substrate 31 is then aligned over the contained members such that each aperture 37 aligns with a respective member. The substrate is then lowered until bridging conductor 39 and solder member 32 contact is made. Heat, e.g., about 300 degrees C. to about 350 degrees C., is then applied to melt member 32, at least in the location of contact with conductor 39. This heat may be applied directly onto member 32 or onto conductor 39 with heat transference onto member 32. A preferred application of such heat is achieved using a microweld where heat is generated via a short pulse of applied voltage/current. Such microweld devices are known and further description is not believed necessary. Alternatively, substrate 31 and solder member 32 may be positioned within a suitable oven (see more below) to effect solder reflow and bonding to the extent depicted in FIG. 2. As yet another alternative, hot nitrogen gas may be directed onto the solder member. Once this heating is complete, substrate 31 and secured member 32 are aligned, precisely, relative to paste 27 and contact made between member 32 and paste 27, as illustrated in FIG. 5. Such alignment may also be facilitated using the frame structure described hereinbelow.

With both circuitized substrates 13 and 31 positioned in the manner described herein and as shown in FIG. 5, the next step in the invention involves heating the substrates, preferably within an oven, to a predetermined temperature sufficient to cause solder paste 27 to "ball up" and substantially surround the substantially spherical solder member 32 to form the cross-sectional configuration depicted in FIG. 6. This formation results in the formed, combined solder structure physically interconnecting the bridging conductor 39 and pad 23 for eventual permanent connection thereto. Significantly, the organic dewetting material 25 functions to assure that the defined heated solder 27 will not wet thereto while also facilitating formation of the aforementioned surrounding configuration. Use of this dewetting material, particularly in the configuration depicted in the drawings, assures ready formation of the solder paste 27 to the surrounding member (27') shown in FIG. 6. This is considered a significant aspect of the invention in that it not only assures a desired ultimate configuration for the combined solder structure but also assures sound physical connection between adjacent conductors 23 and 39.

The above heating of substrates 13 and 31, as stated, preferably occurs within an oven, one example of such a structure being an infrared (IR) continuous belt reflow oven, as are known in the art. Both substrates were located within the oven for a period of from about 1.5 minutes to about 5.0 minutes, depending on the soldering compositions used. The temperature to which these substrates were heated ranged from about 170 degrees Celsius (C.) to about 225 degrees C., or, significantly, substantially equal to or higher than the melting point of paste 27 but lower than solder member 32. Significantly, these temperatures had no adverse affect on either organic substrate, both during this operation as well as during operation thereof subsequently.

Following the heating step defined above, both substrates were removed from the oven and allowed to cool, resulting in final solidification of the combined solder structure (27 and 32). The result of this method as defined above is a bonding between substrates 13 and 31 to provide sound electrical connection between respective electrical connectors thereof. Such a procedure, as defined, is relatively simple in operation and may thus be adapted to mass production techniques for greater cost effectiveness. In one example of the invention, a total of about 500 connections may be simultaneously provided two circuitized substrates of the type defined herein.

In one example of the invention, a printed circuit board was utilized for substrate 13 and possessed an overall thickness of about 0.060 inch. Cylindrical pads 23 of copper were applied, each having an outer diameter of about 0.010 inch and a corresponding thickness of about 0.0014 inch. The defined Probimer 52 organic dewetting material was applied adjacent each pad, this material having a thickness of about 0.003 inch. A volume of about $3.1 \times 10^{-6}$ cubic inches of solder paste 27 was applied per conductive pad 23, using the defined screening technique. This solder paste material possessed an average thickness of about 0.010 inch. The corresponding flexible circuitized substrate was located at a distance ("D" in FIG. 5) of only about 0.008 inch such that the solder member 32, a spherical-shaped ball having a diameter of about 0.025 inch and attached to conductor 39 as described herein, was partly imbedded in paste 27 prior to reflow. Understandably, the above thicknesses and spacing are considered important in order to attain the final bond and connection taught herein.

Figure 10:
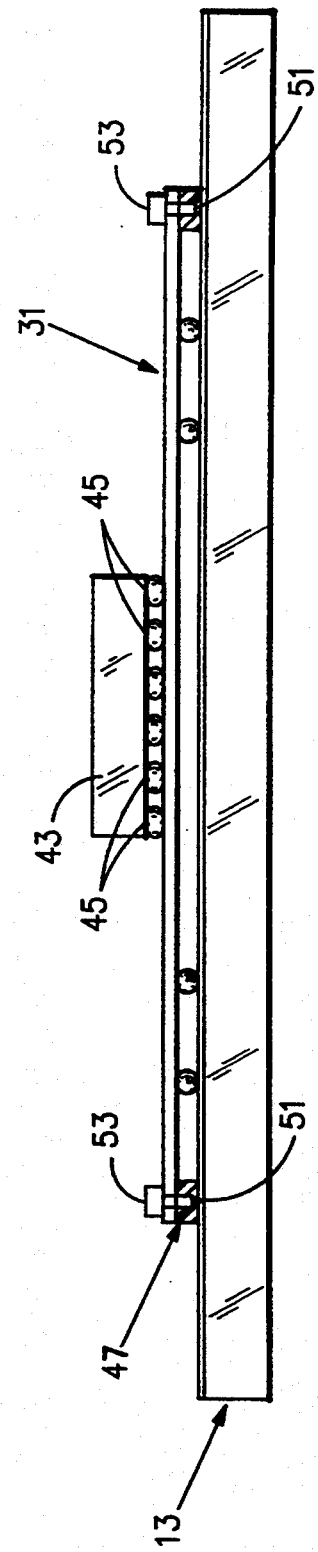
FIG. 10 is a plan view, on a reduced scale over those views in FIGS. 1-9, illustrating an electronic package produced in accordance with the teachings of the invention, the package in FIG. 10 shown to include a frame member as part thereof.

In FIG. 10, there is shown a frame member 47 which may be utilized in performing the steps of the present invention, particularly for the purpose of maintaining the thin flexible substrate 31 substantially parallel to the planar substrate 13 to which it is to be bonded and electrically connected. Prior to such attachment, however, the flexible substrate 31 is preferably electrically coupled to a semiconductor device (chip) 43 in a manner known in the art. Such a device may be electrically connected to respective circuitry (not shown) on substrate 31 using a plurality of solder joints 45, formed in accordance with known techniques of the art. One particular example of such a technique, as mentioned above, is referred to in the art as C4, standing for controlled collapse chip connection, wherein a plurality of solder balls are attached to respective contact sites on the chip and the chip then aligned with desired circuitry on the flexible substrate and bonded thereto. As stated, examples of such a flexible circuitized substrate, including those having semiconductor devices thereon, are illustrated and defined in U.S. Pat. Nos. 4,849,856, 4,914,551 and 4,937,707.

With this flexible circuit so formed (having the semiconductor device thereon), the dielectric portion thereof is stretched across the frame 47 in the manner shown in FIG. 10. This may be accomplished by stretching the substrate's flexible dielectric across opposing frame sides 51 and securing the peripheral edges of the substrate thereto. A preferred method for achieving such securement is to use a plurality of pins 53 which pass through provided apertures within the substrate's outer periphery and into capture holes located within the opposed sides 51. In a preferred embodiment of the invention, a substantially rectangularly shaped frame (having four substantially equal length sides 51) is utilized to accommodate a similarly configured circuitized substrate 31 having a semiconductor device electrically coupled at the approximate center thereof. Frame 47 and substrate 31 are thus clearly understood to be separate members which are joined together in the manner defined herein.

Alternatively, substrate 31' may be retained on the frame sides 51 using an adhesive or the like, if a more permanent type of securement is desired. Once the substrate has been stretched across frame 47, this subassembly is then located on the upper surface of substrate 13 to assume the position depicted in FIG. 10. Once so positioned, the aforementioned solder bonding operations as illustrated in FIGS. 5 and 6 may occur. That is, the described stretching frame is used to facilitate positioning of the flexible circuitized substrate 31 at the appropriate step in the method illustrated in FIGS. 5 and 6. Use of such a frame 47 thus serves to strategically position the flexible thin substrate at the desired, critical distance from the planar circuitized substrate 13, as is essential to achieve the bonding method taught herein. As also stated, frame 47 may be further utilized to position substrate 31 relative to solder members 32 (as shown in FIG. 1) prior to attachment of members 32 thereto.

Frame 47 is preferably of plastic material, a suitable example being Ryton, a known high temperature plastic. Frame 47 thus does not perform an electrically conductive function with respect to the conductive layer (35) and conductors (39) of the invention. (Ryton is a trademark of Phillips Petroleum Company.) This is not meant to limit the invention, however, in that other materials, including stainless steel and copper may be used.

Thus there has been shown and described a method of bonding a pair of circuitized substrates in order to provide sound electrical connection therebetween. The method as taught herein is ideally suited for mass production to thus provide a cost effective means of providing the resulting products capable of using such circuitized substrates, preferred examples being electronic packages of the type described herein.

While there has been shown and described what are at present considered the preferred embodiments of the invention, it will be understood to those skilled in the art that various changes and modifications may be made therein without departing from the scope of the invention as defined by the appended claims.

What is claimed is:

1. A flexible circuit member comprising:
   a flexible circuitized substrate including a dielectric material having a pair of electrically conductive layers located on opposite sides thereof and a plurality of apertures therein, said electrically conductive layers being electrically coupled together, selected ones of said apertures including an electrical conductor positioned within and/or bridging said selected ones of said apertures, said electrical conductor forming part of one of said conductive layers, one of said conductive layers adapted for having a semiconductor device electrically coupled thereto on one side of said substrate;
   a plurality of solder members, each of said solder members being substantially located along an opposite side of said substrate than said semiconductor device and secured to a respective one of said electrical conductors positioned within and/or bridging said selected ones of said apertures; and
   a frame including a plurality of sides defining an opening therein, the peripheral portion of said flexible circuitized substrate being secured to said sides of said frame, said frame and said circuitized substrate being separate members secured to one another.

2. The member of claim 1 wherein said dielectric material is polyimide.

3. The member of claim 1 wherein said selected ones of said solder members secured to said respective ones of said electrical conductors are each of a substantially spherical configuration.

4. The member of claim 1 wherein said solder members are each comprised of 10:90 tin:lead solder.

5. The member of claim 1 wherein said frame is plastic.

6. The member of claim 1 wherein said frame is comprised of metallic material.

7. The member of claim 6 wherein said metallic material of said frame is selected from the group consisting of copper and stainless steel.

8. The member of claim 1 wherein said frame is secured to said flexible circuitized substrate using an adhesive.

9. The member of claim 1 wherein said frame is secured to said flexible circuitized substrate using pins.

10. The member of claim 1 wherein said frame is of substantially rectangular shape.

11. The member of claim 1 further including a plurality of solder joints, said solder joints providing said electrically coupling of said semiconductor device to said conductive layer of said flexible circuitized substrate.

12. The member of claim 11 wherein said solder joints and said solder members are substantially located on opposite sides of said flexible circuitized substrate.

* * * * *